United States Patent
Bandyopadhyay et al.

(10) Patent No.: US 7,253,125 B1
(45) Date of Patent: Aug. 7, 2007

(54) METHOD TO IMPROVE MECHANICAL STRENGTH OF LOW-K DIELECTRIC FILM USING MODULATED UV EXPOSURE

(75) Inventors: Ananda K. Bandyopadhyay, West Linn, OR (US); Seon-Mee Cho, Beaverton, OR (US); Haiying Fu, West Linn, OR (US); Easwar Srinivasan, Beaverton, OR (US); David Mordo, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 77 days.

(21) Appl. No.: 10/825,888

(22) Filed: Apr. 16, 2004

(51) Int. Cl.
*H01L 21/00* (2006.01)
(52) U.S. Cl. .............................. 438/795; 257/E21.347
(58) Field of Classification Search ................ 438/795; 257/E21.347
See application file for complete search history.

(56) References Cited

U.S. PATENT DOCUMENTS

| | | | |
|---|---|---|---|
| 4,357,451 A | 11/1982 | McDaniel |
| 4,882,008 A | 11/1989 | Garza et al. |
| 4,885,262 A | 12/1989 | Ting et al. |
| 5,504,042 A | 4/1996 | Cho et al. |
| 5,686,054 A | 11/1997 | Barthel et al. |
| 5,700,844 A | 12/1997 | Hedrick et al. |
| 5,789,027 A | 8/1998 | Watkins et al. |
| 5,849,640 A | 12/1998 | Hsia et al. |
| 5,851,715 A | 12/1998 | Barthel et al. |
| 5,858,457 A | 1/1999 | Brinker et al. |
| 5,920,790 A | 7/1999 | Wetzel et al. |
| 6,140,252 A | 10/2000 | Cho et al. |
| 6,149,828 A | 11/2000 | Vaartstra |
| 6,171,661 B1 | 1/2001 | Zheng et al. |
| 6,177,329 B1 | 1/2001 | Pang |
| 6,232,658 B1 | 5/2001 | Catabay et al. |
| 6,258,735 B1 | 7/2001 | Xia et al. |
| 6,268,276 B1 | 7/2001 | Chan et al. |
| 6,270,846 B1 | 8/2001 | Brinker et al. |
| 6,271,273 B1 | 8/2001 | You et al. |
| 6,306,564 B1 | 10/2001 | Mullee |
| 6,312,793 B1 | 11/2001 | Grill et al. |
| 6,329,017 B1 | 12/2001 | Liu et al. |

(Continued)

FOREIGN PATENT DOCUMENTS

WO    WO95/07543    3/1995

OTHER PUBLICATIONS

Jan, C.H., et al, *90NM Generation, 300mm Wafer Low k ILD/Cu Interconnect Technology*, 2003 IEEE Interconnect Technology Conference.

(Continued)

*Primary Examiner*—Bradley K Smith
(74) *Attorney, Agent, or Firm*—Beyer Weaver LLP.

(57) ABSTRACT

Methods and apparatus for improving mechanical properties of a dielectric film on a substrate are provided. In some embodiments, the dielectric film is a carbon-doped oxide (CDO). The methods involve the use of modulated ultraviolet radiation to increase the mechanical strength while limiting shrinkage and limiting any increases in the dielectric constant of the film. Methods improve film hardness, modulus and cohesive strength, which provide better integration capability and improved performance in the subsequent device fabrication procedures such as chemical mechanical polishing (CMP) and packaging.

32 Claims, 5 Drawing Sheets

U.S. PATENT DOCUMENTS

| | | |
|---|---|---|
| 6,329,062 B1 | 12/2001 | Gaynor |
| 6,331,480 B1 | 12/2001 | Tsai et al. |
| 6,340,628 B1 | 1/2002 | Van Cleemput et al. |
| 6,365,266 B1 | 4/2002 | MacDougall et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,420,441 B1 | 7/2002 | Allen et al. |
| 6,444,715 B1 | 9/2002 | Mukherjee et al. |
| 6,455,417 B1 | 9/2002 | Bao et al. |
| 6,479,374 B1 | 11/2002 | Ioka et al. |
| 6,500,770 B1 | 12/2002 | Cheng et al. |
| 6,548,113 B1 | 4/2003 | Birnbaum et al. |
| 6,573,030 B1 | 6/2003 | Fairbairn et al. |
| 6,576,345 B1 | 6/2003 | Cleemput et al. |
| 6,596,467 B2 | 7/2003 | Gallagher et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,667,147 B2 | 12/2003 | Gallagher et al. |
| 6,677,251 B1 | 1/2004 | Lu et al. |
| 6,715,498 B1 | 4/2004 | Humayun et al. |
| 6,756,085 B2 * | 6/2004 | Waldfried et al. .......... 427/515 |
| 6,797,643 B2 | 9/2004 | Rocha-Alvarez et al. |
| 6,805,801 B1 | 10/2004 | Humayun et al. |
| 6,812,043 B2 | 11/2004 | Bao et al. |
| 6,815,373 B2 | 11/2004 | Singh et al. |
| 6,831,284 B2 | 12/2004 | Demos et al. |
| 6,846,380 B2 | 1/2005 | Dickinson et al. |
| 6,848,458 B1 | 2/2005 | Shrinivasan et al. |
| 6,849,549 B1 | 2/2005 | Chiou et al. |
| 6,867,086 B1 | 3/2005 | Chen et al. |
| 6,903,004 B1 | 6/2005 | Spencer et al. |
| 6,914,014 B2 | 7/2005 | Li et al. |
| 6,943,121 B2 | 9/2005 | Leu et al. |
| 7,018,918 B2 | 3/2006 | Kloster et al. |
| 7,087,271 B2 | 8/2006 | Rhee et al. |
| 7,094,713 B1 | 8/2006 | Niu et al. |
| 2002/0001973 A1 | 1/2002 | Wu et al. |
| 2002/0016085 A1 | 2/2002 | Huang et al. |
| 2002/0034626 A1 | 3/2002 | Liu et al. |
| 2002/0064341 A1* | 5/2002 | Fauver et al. ................. 385/25 |
| 2002/0106500 A1 | 8/2002 | Albano et al. |
| 2002/0123240 A1 | 9/2002 | Gallagher et al. |
| 2002/0141024 A1* | 10/2002 | Retschke et al. ........... 359/204 |
| 2002/0192980 A1 | 12/2002 | Hogle et al. |
| 2003/0064607 A1 | 4/2003 | Leu et al. |
| 2003/0066544 A1 | 4/2003 | Jur et al. |
| 2003/0119307 A1 | 6/2003 | Bekiaris et al. |
| 2003/0157248 A1 | 8/2003 | Watkins et al. |
| 2003/0198895 A1 | 10/2003 | Toma et al. |
| 2004/0069410 A1 | 4/2004 | Moghadam et al. |
| 2004/0096586 A1 | 5/2004 | Schulberg et al. |
| 2004/0096593 A1 | 5/2004 | Lukas et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0102032 A1 | 5/2004 | Kloster et al. |
| 2004/0161532 A1 | 8/2004 | Kloster et al. |
| 2004/0170760 A1 | 9/2004 | Meagley et al. |
| 2004/0185679 A1 | 9/2004 | Ott et al. |
| 2005/0064698 A1 | 3/2005 | Chang et al. |
| 2006/0110931 A1 | 5/2006 | Fukazawa et al. |
| 2006/0197881 A1 | 9/2006 | Kang et al. |

OTHER PUBLICATIONS

Wu et al., U.S. Appl. No. 10/789,103, entitled: Methods For Producing Low-K CDO Films With Low Residual Stress.

Wu et al., U.S. Appl. No. 10/820,525, entitled: Methods For Producing Low-K CDO Films With Low Residual Stress.

Wu et al., U.S. Appl. No. 10/800,409, entitled: Methods For Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Humayun et al., "Method For Forming Porous Films By Porogen Removal Combined With In Situ Modification", U.S. Appl. No. 10/404,693, filed Mar. 31, 2003, Office Action dated Mar. 15, 2005.

Tipton et al., "Method Of Porogen Removal From Porous Low-K Films Using UV Radiation", U.S. Appl. No. 10/672,311, filed Sep. 26, 2003, Office Action dated Sep. 7, 2004.

Tipton et al., "Method Of Porogen Removal From Porous Low-K Films Using UV Radiation", U.S. Appl. No. 10/672,311, filed Sep. 26, 2003, Office Action dated Dec. 28, 2004.

Tipton et al., "Method For Removal Of Porogens From Porous Low-K Films Using Supercritical Fluids", U.S. Appl. No. 10/672,305, Office Action dated Mar. 22, 2005.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Method For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

Humayun et al., "Method For Forming Porous Films By Porogen Removal Combined With In Situ Surface Modification", U.S. Appl. No. 10/404,693, filed Mar. 31, 2003.

Cho et al., "Method And Apparatus For UV Exposure Of Low Dielectric Constant Materials For Porogen Removal And Improved Mechanical Properties", U.S. Appl. No. 10/800,377, filed Mar. 11, 2004.

Wu et al., "Methods Of Porogen Removal For Porous Low Dielectric Constant Films Using Plasma Treatments", U.S. Appl. No. 10/807,680, filed Mar. 23, 2004.

Tipton et al., "Method Of Porogen Removal From Porous Low-K Films Using Uv Radiation", U.S. Appl. No. 10/672,311, Sep. 26, 2003.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Gangpadhyay et al., "The First International Surface Cleaning Workshop," Northeastern University, Nov. 11-14, 2002.

Justin F. Gaynor, "In-Situ Treatment of Low-K Films With a Silylating Agent After Exposure To Oxidizing Environments," U.S. Appl. No. 10/056,926 filed Jan. 24, 2002, 34 Pages.

U.S. Office Action mailed Jul. 13, 2005, from U.S. Appl. No. 10/672,311.

U.S. Office Action mailed Jul. 27, 2005, from U.S. Appl. No. 10/785,235.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Sep. 8, 2006, from U.S. Appl. No. 10/404,693.

U.S. Office Action mailed Sep. 7, 2006, from U.S. Appl. No. 10/820,525.

U.S. Office Action mailed Jul. 12, 2006, from U.S. Appl. No. 10/672,305.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Dhas et al., "Method of Reducing Defects in PECVD TEOS Films," Novellus Systems, Inc., U.S. Appl. No. 11/396,303, filed Mar. 30, 2006, pp. 1-21.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

\* cited by examiner

METHOD TO IMPROVE MECHANICAL STRENGTH OF LOW-K DIELECTRIC FILM USING MODULATED UV EXPOSURE

CROSS-REFERENCE TO RELATED APPLICATIONS

This application is related to U.S. patent application Ser. No. 10/800,377, filed on Mar. 11, 2004, titled "Method and Apparatus for UV Exposure of Porous Low-k Films for Porogen Removal and Film Hardening," by Cho et al; U.S. patent application Ser. No. 10/807,680, filed on Mar. 23, 2004, titled "Methods of Porogen Removal for Porous Low Dielectric Constant Films Using Plasma Treatments," by Wu et al.; U.S. patent application Ser. No. 10/672,311, filed on Sep. 26, 2003, titled "Method of Porogen Removal from Porous Low-k Films Using UV Radiation," by Tipton et al.; and U.S. patent application Ser. No. 10/404,693, filed on Mar. 31, 2003, titled "Method for Forming Porous Films by Porogen Removal Combined with In Situ Surface Modification," by Humayun et al., each of which is incorporated herein by reference in its entirety for all purposes.

BACKGROUND

This invention relates to methods and apparatus for preparing dielectric films for integrated circuits, particularly carbon-doped oxide (CDO) dielectric films. More specifically, the invention employs modulated ultraviolet radiation to increase the hardness and modulus of the film. In preferred embodiments, the film shrinkage and dielectric constant are minimally affected.

Modern integrated circuit manufacturing requires advanced techniques for creating materials having low dielectric constants (low-k materials). Using low-k materials as the inter-metal and/or inter-layer dielectric in integrated circuits reduces the delay in signal propagation due to capacitive effects. The lower the dielectric constant of the dielectric film, the lower the capacitance of the dielectric and the lower the RC delay of the integrated circuit (IC).

Low k dielectrics are conventionally defined as those materials that have a dielectric constant lower than that of silicon dioxide, that is k<4. However, with ever increasing technology demands, present efforts are focused on developing low-k dielectric materials with k less than 2.5. Methods of obtaining these ultra low-k materials include doping silicon dioxide with carbon to create a carbon-doped oxide (CDO), or incorporating air voids within a low-k dielectric to create a porous dielectric material, or a combination of both (i.e., creating a CDO porous dielectric).

Although these approaches of doping and/or introducing air voids into the dielectric will reduce the dielectric constant of films, they can also have detrimental effects on quality of the films, in particular the mechanical strength of the films. Introducing carbon (e.g., methyl groups) or air voids into the dielectric will reduce the density of the film and thereby reduces the mechanical strength of the films. These less dense films may not withstand the mechanical stress of subsequently performed integrated circuit fabrication processes such as chemical mechanical polishing (CMP) and packaging. That is, the films may crack or become crushed internally. In addition, these films tend to poorly adhere to other materials and may delaminate at interfaces with adjacent layers when subjected to the mechanical forces produced by CMP and other fabrication processes.

What are needed therefore are methods of improving the mechanical strength and adhesive properties of low-k dielectric films without substantially deleteriously affecting the desired properties of the low-k films.

SUMMARY

The present invention addresses this need by providing methods for improving the mechanical properties of a dielectric film on a partially fabricated integrated circuit while limiting shrinkage and limiting any increase in dielectric constant. Methods include (a) providing the partially fabricated integrated circuit having a low-k dielectric film formed thereon, (b) exposing the dielectric film to UV radiation of modulated intensity to thereby improve the mechanical properties of the dielectric film while limiting shrinkage and limiting any increases in dielectric constant and (c) forming one or more additional layers on the partially fabricated integrated circuit. The low-k dielectric film may be a porous or non-porous (sometimes referred as "dense") dielectric film.

While the methods of the present invention can be employed to improve the mechanical properties of many different types of dielectric material in many different applications, much of this document will focus on carbon-doped silicon oxides (CDO) as the dielectric material. In other embodiments, silicon oxide may be doped with fluorine and/or other elements and even metals. Generally, the CDO films are comprised of carbon (typically in the form of methyl or other hydrocarbon groups) in addition to silicon and oxygen. A wide range of precursors is available to produce CDO films. These include various carbon containing compounds and silicon containing compounds. In many cases, a single precursor compound will include silicon, carbon, and sometimes oxygen.

In some cases the precursor film is formed by co-depositing the porogen with the structure former. The porogen is frequently, but not necessarily, an organic material and the structure former a silicon-containing material. As general examples, the structure former can be produced from silanes, alkylsilanes (e.g., trimethylsilane, di-tert-butylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes, cyclic siloxanes (e.g. octamethylcyclotetrasiloxane (OMCTS) and tetramethylcyclotetrasiloxane (TMCTS)), silylalkenes (e.g., vinyltrimethylsilane (VTMS)), silylalkynes (e.g., trimethylsilylacetylene (TMSA), bis-trimethylsilylacetylene (BT-MSA), or a combination thereof. One preferred class of porogen compounds is the polyfunctional cyclic non-aromatic compounds. Examples of such compounds are terpenines such as alpha terpenine (ATRP), norborenes such as 5-ethylidene-2-norbornene (ENB), limonene ($C_2H_5OH$) and other related compounds.

The dielectric may be of the "high density" variety (substantially pore free) or the "low density" variety (porous). The pores in porous films can be of many different sizes, ranging from nanometer scale to micron scale depending on the application. Regardless of its structure and composition, the material preferably has a relatively low dielectric constant (e.g., less than about 4, and more typically less than about 3) and relatively high mechanical strength. In many applications, the thickness of the dielectric film is between about 50 Angstroms and 5 micrometers and more preferably between about 500 Angstroms and 5,000 Angstroms.

Improvements of the mechanical properties of the dielectric film as a result of using methods of the invention include improvements in the hardness and stiffness of the film. The hardness of a nonporous film is preferably increased by about 0.3 GPa or greater and more preferably it is increased by about 0.7 GPa or greater (which corresponds to a increase in modulus of about 4.6 GPa or greater). The hardness of a porous film is preferably increased by about 0.9 Gpa or greater (which corresponds to a increase in modulus of about 5.0 GPa or greater).

In addition to improving the mechanical strength of the dielectric film, techniques described herein limit the film shrinkage and any increases in dielectric constant that may typically accompany UV exposure of dielectric films. In preferred embodiments, the dielectric non-porous film shrinks by no more than about 10% and the dielectric constant increases by no more than about 1% whereas a porous film will preferably shrink by no more than about 25% and more preferably by no more than about 15% and the dielectric constant increases by no more than about 8% and more preferably by no more than about 4%.

As indicated, the present invention involves exposing the dielectric film to a UV source that produces modulated or oscillating UV radiation at the substrate surface. The choices of UV wavelength(s), total exposure time and intensity, modulation period and amplitude, etc. depend on a number of factors, including the thickness of the dielectric film and the composition of the dielectric film. In some preferred embodiments, the oscillating UV radiation has a period of between about 1µ seconds and 5 minutes, and more preferably between about 1 millisecond and 30 seconds. The duty cycle of the UV source preferably ranges between about 1% and about 90%. The total exposure time to oscillating UV radiation is preferably between about 1 second and about 60 minutes. The amplitude (i.e., intensity variation) of the UV radiation will preferably vary between about 0 and 3 Watts/cm$^2$. Typical wavelengths used for CDO films range between about 150 nm and 800 nm.

The apparatus employed to implement the invention can have one or more UV sources. In some embodiments described herein, the apparatus will have a single UV source. The modulation may be introduced by any of many different mechanisms for controlling the UV radiation delivered to the work piece. Examples include controlling UV source power, controlling mechanical barriers (e.g., an aperture or rotating chopper) between the UV source and the substrate, and controlling an optical element (e.g., a filter, lens, or mirror) between the source and the substrate.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF A PREFERRED EMBODIMENT

The Dielectric Film

In the following description, numerous specific details are set forth in order to provide a thorough understanding of the present invention, which pertains to improving the mechanical strength of a low-k dielectric film by way of modulated UV exposure. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention improves the dielectric film's mechanical properties with relatively minimal increase of k value and minimal film shrinkage. As used herein "semiconductor substrates" include any semiconductor substrate at any of the various states of manufacture/fabrication in the production of integrated circuits. Thus, the concept of a semiconductor substrate includes whole wafers and dies, partially fabricated integrated circuits and completely fabricated integrated circuits, whether or not packaged, and the like.

Many different types of low-k dielectric films may be processed using the present invention. This document will focus on carbon-doped silicon oxide (CDO) films. These can have various amounts of carbon (typically in the form of hydrocarbon groups such as methyl and/or methylene groups) depending upon desired film qualities and applications. Note, however, that methods of the invention are not limited to CDO films. For example, the methods may also be used to effectively strengthen silicon dioxide films containing other dopants such as fluorine or various metals. The invention may also extend to undoped silicon oxide films and even non-silicon dioxide based dielectric materials.

The present invention can be used on both porous and non-porous (sometimes referred to as "dense") dielectric films. Any suitable method for forming a non-porous dielectric film may be used. One method involves PECVD methods using a silane, silane derivative, siloxane, siloxane derivative or a combination of two or more of these compounds. Methods of fabricating porous films typically involve forming a composite film (referred to herein as a "precursor film") containing two components: a porogen (typically an organic material of low or high molecular weight (e.g., a polymer)) and a structure former or dielectric material (e.g., a silicon containing material). Once the precursor film is formed on the substrate, the porogen component is removed, leaving a structurally intact porous low-k dielectric matrix. Various porogens and porogen-removal techniques are described in U.S. patent application Ser. No. 10/800,377, previously incorporated by reference. Generally, a porogen is any removable material that defines void regions in a dielectric matrix. The porogen may be removed by thermal methods, treatment with plasma, supercritical extraction, UV-mediated techniques, electron beam treatment and the like.

The dielectric film (or precursor film in the case of a porous dielectric) may be formed by any of numerous techniques. Examples include spin-coating processes, print-on, dip coating, thermal process, supercritical deposition process, and chemical vapor deposition—particularly plasma enhanced chemical vapor deposition (PECVD). In one example, a methylsilsesquioxane film is formed using spin-on-glass techniques. In other examples, the film is deposited using standard CVD or PECVD methods in which organo-silane precursors such as methylsilanes are used with oxidizing agents such as oxygen, nitrous oxide or carbon dioxide, or an inert gas such as nitrogen, argon, helium, or a mixture of oxidizing gas and inert gas. A range of examples of precursors for the dielectric film (particularly for CVD processes) includes silane, alkylsilanes (e.g., trimethylsilane, di-tert-butylsilane, and tetramethylsilane), alkoxysilanes (e.g., tetraethoxysilane (TEOS), methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)), silylalkenes (e.g., vinyltrimethylsilane (VTMS)), silylalkynes (e.g., trimethylsilylacetylene (TMSA), bis-trimethylsilylacetylene (BTMSA). Any suitable method may be used to deposit the dielectric film, including a PECVD method.

The thickness of the dielectric layer depends upon the ultimate application. As an example, the thickness may range between about 50 to 1500 angstroms for a hard mask application. For an interlayer dielectric or packaging application, the thickness may range up to about 2 to 3 microns. In some cases, extra thickness is required to provide some amount of sacrificial dielectric to accommodate a subsequent planarization or polishing step. In some cases, the thickness of the precursor layer may be driven in part by the ability of the UV radiation to penetrate the film and remove the porogen. Therefore, relatively thinner precursor layers may be required for some processes.

Methods of the invention involve improving 1) the "mechanical performance" of the porous low-k dielectric film, 2) with minimal k value increase, and 3) with minimal film shrinkage. Mechanical performance may be manifest in terms of hardness, modulus, intrinsic stress, etc. Hardness and modulus are well defined within the art and will not be discussed in detail herein. Measures of film hardness and modulus presented herein may be made with any suitable apparatus including nano-indenter device.

One way to characterize mechanical performance of a dielectric film is via a "cracking threshold" measurement. This is a measure of thickness of a dielectric film on a blank substrate (e.g., a flat 200 mm wafer) that can be deposited without forming a crack. In a typical experiment, the dielectric is deposited to various thicknesses using a single set of process conditions. The resulting wafer (with dielectric film) is set aside without disturbance for a period of time (e.g., one day) and then examined for cracks. The greatest thickness at which no crack is observed is the cracking threshold. For many processes, the cracking threshold is measured in micrometers.

The Modulated UV Source

As indicated, methods of the invention involve exposing a dielectric film to modulated UV radiation. It will be appreciated by those skilled in the art that the UV radiation used with the invention encompasses near-UV, far-UV, as well as UV wavelengths. Some films may be more effectively treated using UV light with particular ranges of wavelengths and/or intensities. In the present invention, the intensity of the UV radiation is modulated and typically oscillating. The modulated UV radiation can be achieved in any number of ways including providing a UV light source adapted to providing intermittent UV light intensities, providing more than one UV light source that can be turned on and off intermittently, shielding the substrate from UV exposure intermittently by using a shutter or light deflector (lens or mirror) for example, or moving the substrate intermittently in and out of the UV radiation exposure area. Some of these methods will be described herein.

Dielectric film exposure to UV radiation in general has been studied previously for various applications, including for porogen removal as well as mechanical strengthening applications. These applications of UV exposure are discussed, for example, in the previously referenced U.S. patent application Ser. No. 10/404,693, and U.S. patent application Ser. No. 10/800,377, both previously incorporated by reference. The present invention focuses on using modulated or oscillating UV exposure.

Figure 1:
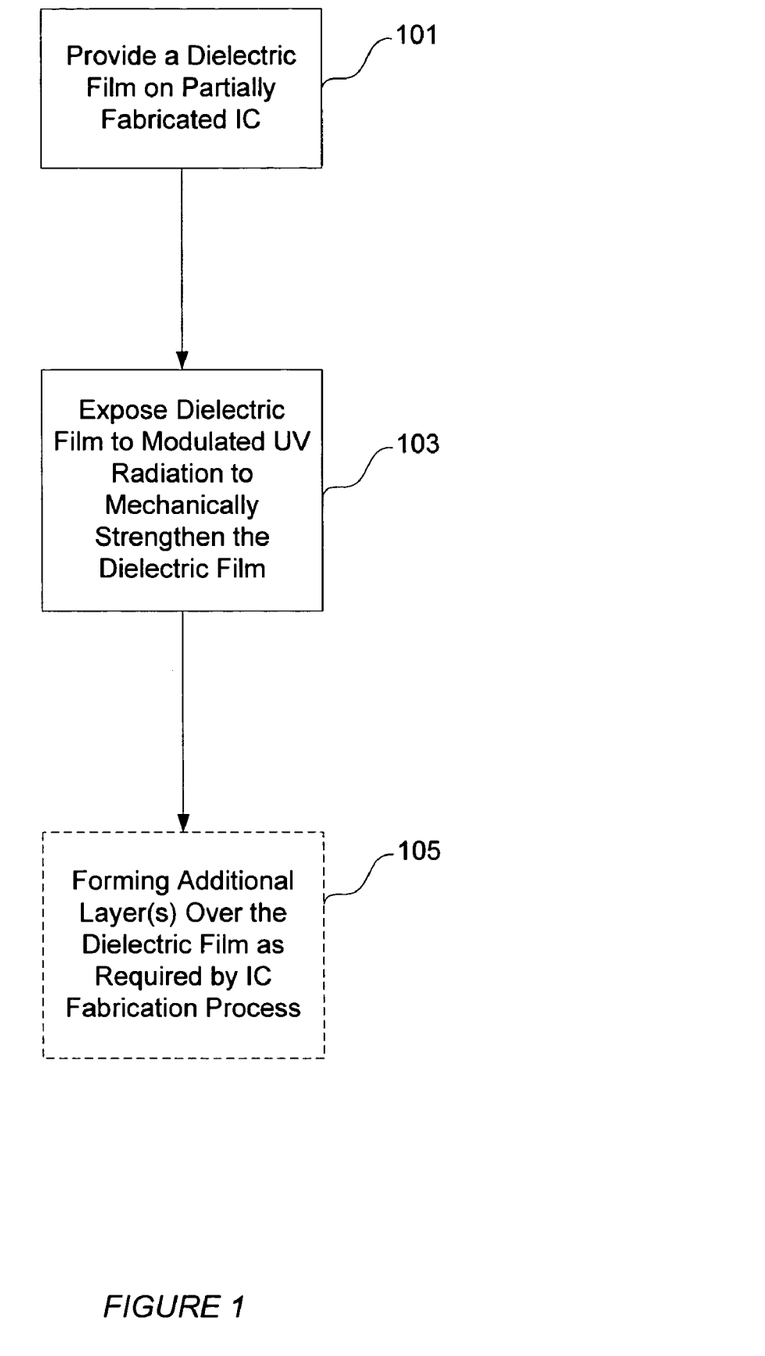
FIG. 1 is a flowchart summarizing stages of example implementations of the invention.

For context, FIG. 1 provides a flow chart depicting one general high-level process flow in accordance with some embodiments of the present invention. Initially, a dielectric film is provided on a substrate as indicated by a process block 101. As indicated, the thickness of the dielectric film will depend upon the ultimate application. It is worth noting that for identical compositions, porous films have lower dielectric constants than non-porous CDO films. For example, porous films typically have k values ranging between about 1.8 and 2.8 whereas non-porous CDO films typically have k values ranging between about 2.4 and 4.0. As described above, various techniques for forming a CDO film may be employed. It is noted again that the invention is not limited to any particular type of dielectric film or deposition method.

The dielectric film, provided at block 101, is exposed to modulated UV radiation, as indicated at block 103. As mentioned previously, the modulated UV radiation can be achieved using any of a number of techniques. In preferred embodiments, one UV radiation source, that is capable of providing modulated UV intensities, is used. An example of a suitable apparatus for the invention is described in further detail.

Returning to FIG. 1, after dielectric film is exposed to modulated UV radiation, additional layer(s) as required by the IC manufacturing process is/are formed over the dielectric film. See block 105. In some cases, the dielectric film is etched with vias and/or trenches before the additional layer(s) is/are deposited. After operation 105, the process flow of FIG. 1 is complete.

Figure 2:
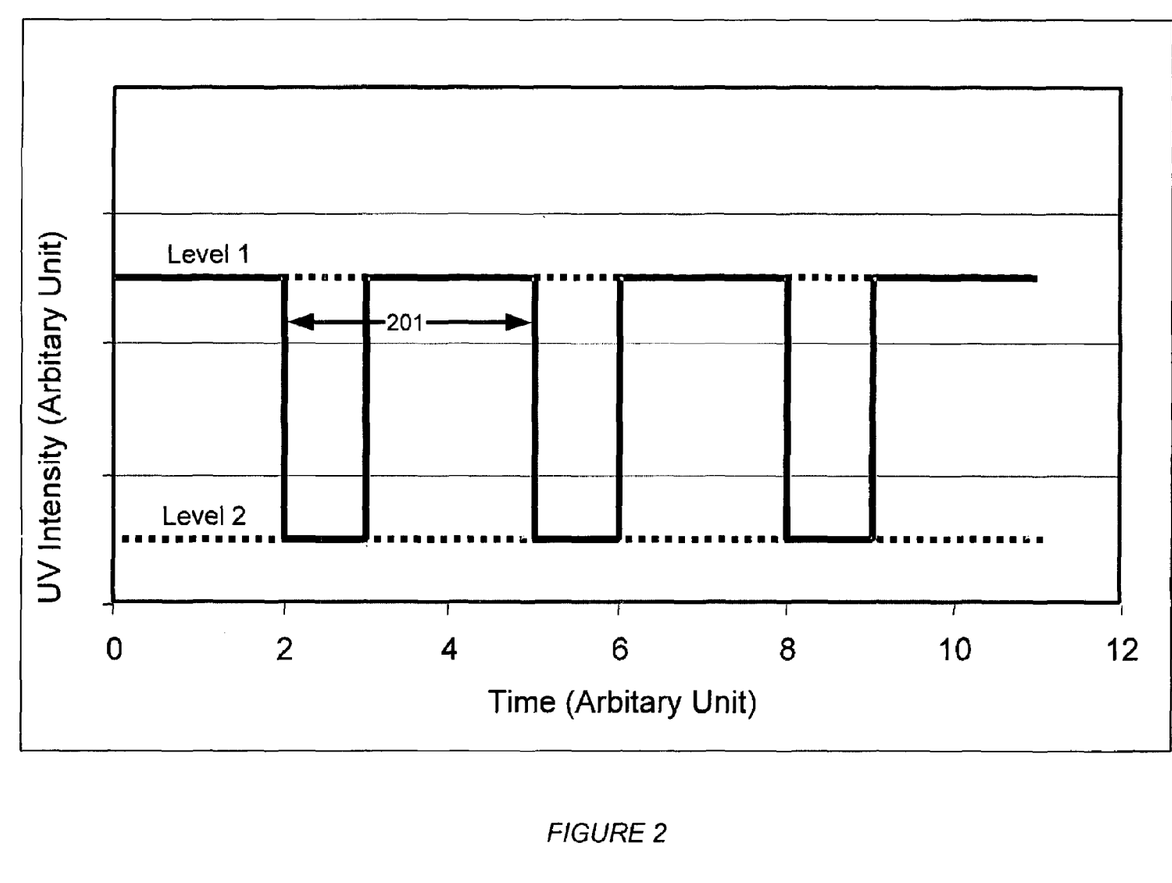
FIG. 2 is a chart representing an example of modulated UV exposure as a function of time in accordance with the invention.

FIG. 2 is a graphical representation of UV exposure as a function of time in accordance with an example of the present invention. UV Intensity (y-axis) and Time (x-axis) are in arbitrary units. UV radiation reaching the substrate is modulated between Level 1 intensity and Level 2 intensity. Arbitrarily, Level 1 intensity is higher than Level 2 intensity. Substrate exposure to Level 1 intensity occurs periodically at intervals with particular time durations and exposure to Level 2 intensity occurs periodically at intervals with other time durations. As shown, the period of oscillation is given by time 201. In the depicted example, Level 1 phase is about twice the duration of Level 2 phase. If Level 2 intensity was zero (as would occur if the UV light source was turned OFF or blocked during Level 2 phases), the duty cycle of the UV light source would be 67% (i.e., ON two thirds of the time and OFF one third of the time). The graph of FIG. 2 shows four cycles of Level 1 exposures, but of course any number of cycles of exposures can be used as necessary to effect improvement in the dielectric layer's mechanical properties.

In a fabrication environment, various characteristics of the modulation may impact the process. These include the maximum and minimum intensity levels, the period of the modulation cycle, the duty cycle, the total exposure time. In preferred embodiments, the light intensity amplitude may be between about 1 $\mu W/cm^2$ and 3 $W/cm^2$. In a typical case, the minimum light intensity level is 0 (e.g., light source is turned OFF), although this is not necessary. The period of the modulation may be between about 1 µs seconds and 10 minutes, for example. For at least some CDO films, it has been found that a cycle period of between about 1 seconds and 30 seconds works well. The duty cycle (e.g., percentage of time the light source is ON) is preferably between about 1% and 90% and more preferably between 10% and 80%. The total time during which the dielectric film is exposed to the modulated UV radiation may be between about 1 second and 60 minutes, more preferably between about 30 seconds and 5 minutes. In some cases, it will be beneficial to control the number of modulation cycles as opposed to merely controlling the total exposure time. The UV wavelengths used can also vary, depending in part on the film composition and thickness. For certain CDO films, UV wavelengths between about 150 nm and 800 nm are used. Note that some UV sources will include a relatively wide spectral power distribution, with intensity peaks at multiple wavelengths. And if multiple UV sources are used, there will be, of course, multiple wavelengths. Also note that in some embodiments, the modulation characteristics may vary from cycle to cycle. For example, the amplitude, period, or duty cycle may vary from one cycle to the next in a defined or random mode.

The wafer substrate temperature may influence the hardening process. In some embodiments, higher temperatures may be more effective, but the temperature should not be too high as to cause damage to the substrate device. In general, temperatures below about 450 degrees C. are preferable, more preferably not greater than about 400 degrees C., as higher temperatures can damage a partially fabricated device, particularly one that employs copper lines. Typical temperatures range between about room temperature (i.e., 20 degrees C.) up to 450 degrees C. It should be noted that exposure to UV radiation can itself contribute to substrate heating.

As mentioned previously, low-k dielectric films treated with UV exposure result in films with improved mechanical properties (e.g., increased hardness and modulus). In preferred embodiments, the hardness of a non-porous film is increased by about 0.3 GPa or greater, and more preferably by about 0.7 GPa or greater. (which corresponds to an improvement in modulus of about 4.6 GPa or greater) after modulated UV treatment in accordance with the invention. For a porous film, the hardness is increased by about 0.5 GPa or greater, and more preferably by about 0.9 GPa or greater (which corresponds to an improvement in modulus of about 5.0 GPa or greater) after modulated UV treatment in accordance with the invention.

In addition to improving the mechanical properties of the film, modulated UV exposure, as compared to continuous UV exposure, has fewer deleterious effects. Specifically, films exposed to modulated UV radiation experience less film shrinkage, less increase in dielectric constant, and higher mechanical strength. Examples showing advantages of the invention are presented in FIGS. 3 and 4 and described in the next section. In general, the dielectric film preferably will shrink by no more than about 25% (porous films), or no more than about 10% (non-porous films), after exposure to modulated UV radiation. Furthermore, the dielectric constant of the film preferably will increase by no more than about 8% (more preferably by no more than about 4%) for a porous film and by no more than about 1% for a non-porous film after such exposure.

EXAMPLES

As indicated above, it has been found that exposure to continuous UV radiation can cause unacceptable shrinkage of CDO dielectric films. In addition, it has been found exposing such dielectric films to continuous UV radiation typically increases the k value of these films. Although not wishing to be bound to theory, this is thought to be in part due to deleterious bond reconstruction within the film. Thus, until this invention there was often an unacceptable trade-off in exposing a dielectric film to UV radiation: enhanced mechanical strength coupled with too much shrinkage and dielectric constant or acceptable levels of shrinkage and dielectric constant increase coupled with unacceptable mechanical strength. Use of modulated UV radiation, in accordance with this invention, avoids this trade-off and produces dielectric films with good mechanical strength, limited shrinkage, and limited increase in dielectric constant.

Figure 3:
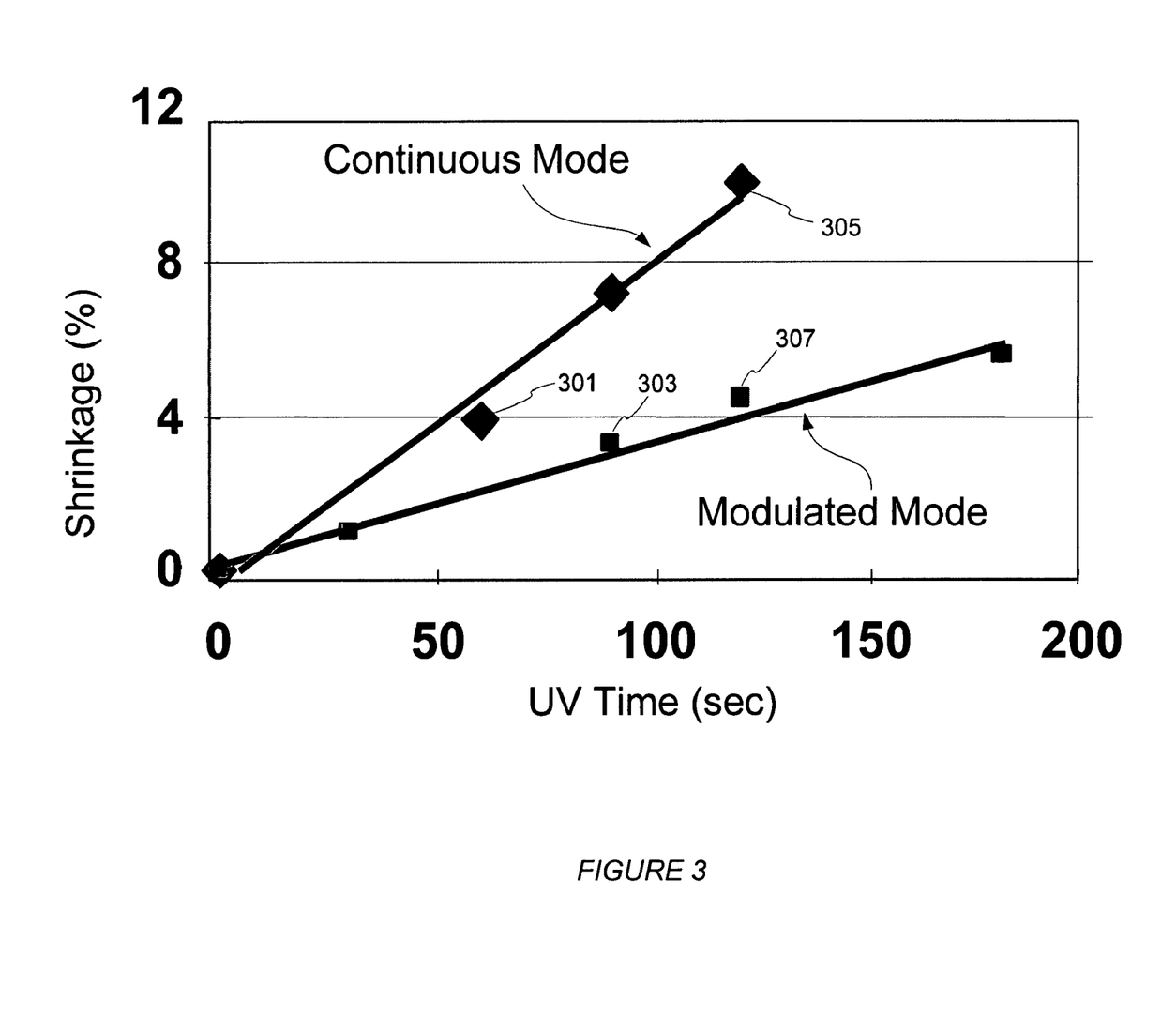
FIG. 3 is a chart representing film shrinkage as a function of UV exposure time using continuous and modulated UV exposure modes.

FIG. 3 is a graph representing the percentage of film shrinkage (y-axis) as a function of time (x-axis) of films exposed to modulated UV radiation and unmodulated UV radiation. One film was exposed to only an unmodulated "Continuous Mode" UV exposure and another film was exposed to only a "Modulated Mode" UV exposure. The film shrinkage of each of the films was measured at different exposure times, as indicated by the data points. The labeled lines indicate the best-fit lines for the data points. Both films were non-porous CDO having thicknesses of about 5000 Angstroms and produced from TMCTS (1,3,5,7-tetramethylcyclotetrasiloxane) and carbon dioxide by PECVD.

The UV power at the surface of the 5,000 Angstrom CDO films was approximately 2 $W/cm^2$ at 100% intensity. The exposure was performed at a base pressure of 8 mTorr and at a temperature of about 100 Celsius in a vacuum chamber. The UV source provided radiation in the range of about 200 to 800 nm, with a peak near 380 nm. In the modulated mode, each cycle comprised 30 seconds of UV exposure at 100% intensity (level 1) followed by 30 seconds of no illumination (0% UV intensity—level 2). In one case, the cycle was repeated 3 times to achieve a total of 90 seconds UV exposure. In another case, the cycle was repeated 6 times to achieve a total of 180 seconds UV exposure.

As shown in FIG. 3, the film treated by Modulated Mode UV exposure experienced significantly less film shrinkage compared to the film treated with Continuous Mode UV exposure. Furthermore, the disparity in the amounts of shrinkage between the two films becomes greater with increasing UV exposure. For example, data point 301 shows that when the film exposed to Continuous Mode UV was exposed for about 60 seconds, it experienced about 4% film shrinkage. In comparison, data point 303 shows that when the film exposed to Modulated Mode UV was exposed for about 90 seconds, it experienced a little over 3% film shrinkage. As another example, data points 305 and 307 show film shrinkage percentages of films exposed to Continuous and Modulated UV, respectively. Both samples had UV exposure time of about 120 seconds. The film exposed to Continuous Mode UV (305) experienced about 10% shrinkage while the film exposed to Modulated Mode UV (307) experience only about 4%. At 180 seconds, the total shrinkage of the modulated mode film was only 5.5%. The film shrinkage was determined by calculating the difference in the thickness measured using a reflectometer or spectroscopic ellipsometer before and after the UV exposure.

Figure 4:
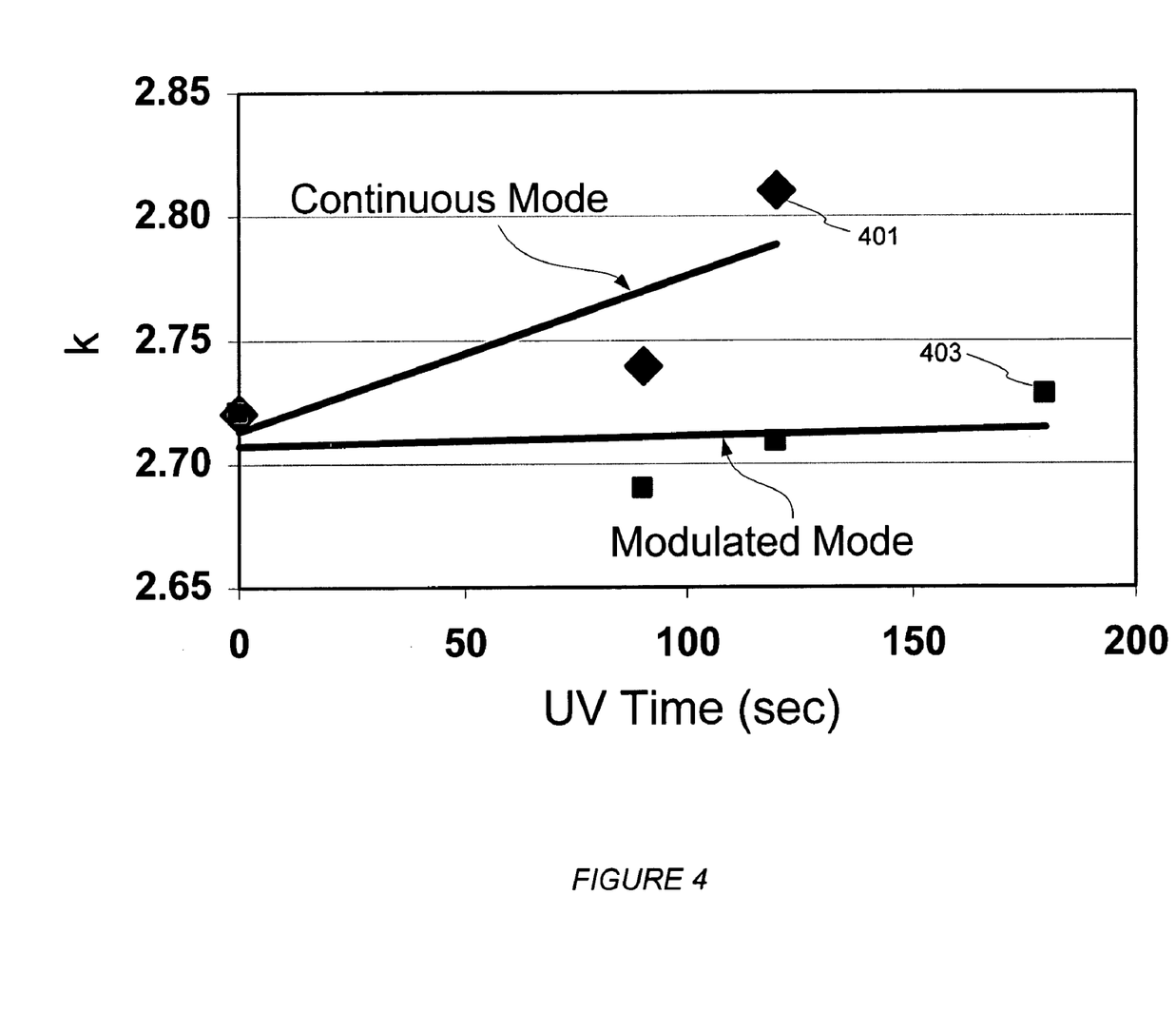
FIG. 4 is a chart representing film dielectric constant as a function of UV exposure time using continuous and modulated UV exposure modes.

It has been found that in addition to ameliorating the effects of thermal shrinkage, modulating the UV radiation can reduce any deleterious increase in the film's dielectric constant (k). This is shown, for example, by the graph of FIG. 4 representing the dielectric constant (y-axis), k, as a function of time (x-axis) of films treated with continuous and modulated UV exposure. As with the films in FIG. 3, both films were non-porous CDO produced from TMCTS (1,3,5,7-tetramethylcyclotetrasiloxane) and having thicknesses of about 5000 Angstroms each. Also, as with the data of FIG. 3, one film was exposed to Continuous Mode UV radiation and another was exposed to Modulated Mode UV radiation. The dielectric constant, k, of each of the films was measured at different exposure times, as indicated by the data points. The best-fit lines for the data points for each are indicated by the labeled lines. The dielectric constant, k was measured by using a SSM Mercury Probe.

As shown by FIG. 4, the films treated by Modulated Mode UV experienced less increase in k compared to the film treated by Continuous Mode UV. Specifically, the k value for the Continuous Mode UV exposed film increased to over 2.8 after about 120 seconds of exposure (see data point 401) while the k value for the Modulated Mode UV exposed film stayed well under 2.75 even after about 180 seconds of exposure (see data point 403).

For the modulated mode treatment, the following film properties were measured.

3 Cycles—Total of 90 Seconds Exposure
Thickness Shrinkage—3%
Shift in Dielectric Constant—0
Hardness—1.60 GPa
Modulus—10.7 GPa
Change in hardness (after treatment—before treatment)—0.32 GPa
Change in modulus (after treatment—before treatment)—2.0 GPa 6 Cycles—Total of 180 Seconds Exposure
Thickness Shrinkage—5.5%
Shift in Dielectric Constant—0
Hardness—1.97 GPa
Modulus—13.3 GPa
Change in hardness (after treatment—before treatment)—0.69 GPa
Change in modulus (after treatment—before treatment)—4.6 GPa In addition to the data presented above for non-porous films, additional experiments with porous CDO films were also performed. Two different porous CDO samples prepared from diethoxymethylsilane (DEMS) and alpha-terpiene (ATRP). They were treated with continuous and modulated UV radiation having an intensity of about 2 Watts/cm$^2$. Prior to UV exposure, both films had k values of about 2.7 and hardness values of about 0.3 GPa. After exposure, the film exposed to continuous UV radiation (about 5 minutes) had a k value of about 2.25, a hardness value of about 1.2 GPa and experienced thermal shrinkage of about 21%. The film exposed to modulated UV radiation (10 cycles of 30 seconds ON and 30 seconds OFF) had a k value of about 2.25, hardness value of about 1.2 GPa and experienced thermal shrinkage of about 17%. Note that for these porous film samples the k values decreased after exposure to UV radiation. This is due to the fact that some porogen material was likely removed during UV exposure, resulting in a lowering of the measured k value.

Apparatus

The present invention can be implemented in many different types of apparatus. Generally, the apparatus will include one or more chambers (sometimes referred to as process vessels) that house one or more wafers (substrates) and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during porogen removal and post porogen removal processes such as anneal, silanol capping and/or treatment with reactive gas plasma, if used. For certain operations in which the wafer is to be heated, the apparatus may include a heating platen.

Figure 5:
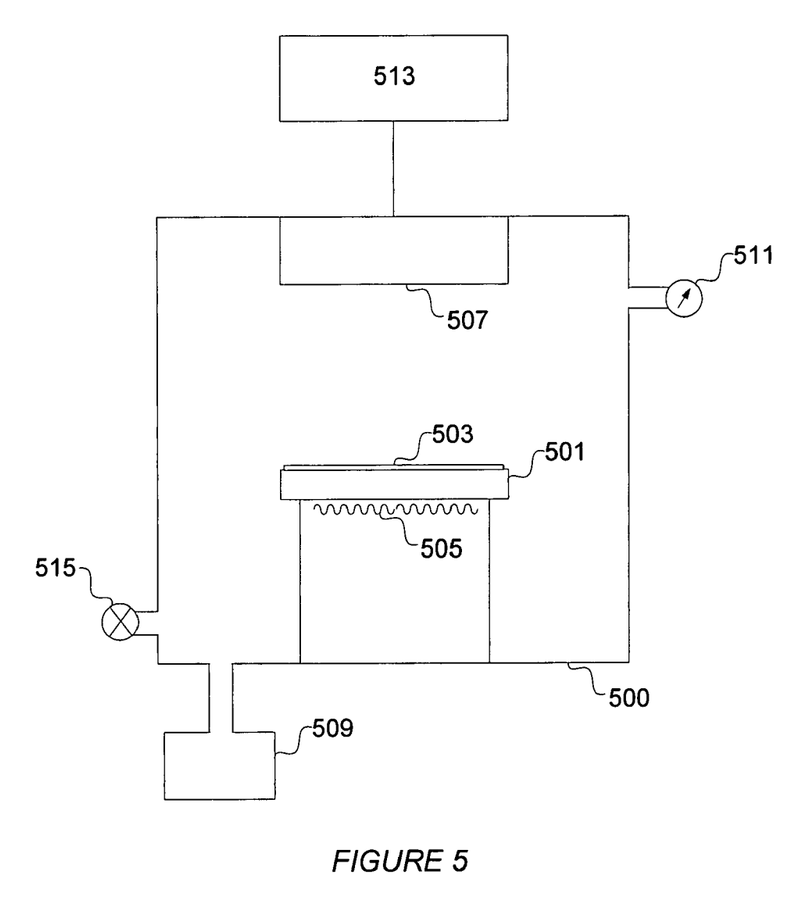
FIG. 5 is a schematic representation of an UV apparatus suitable for film treatment in accordance with some embodiments of this invention.

FIG. 5 is a schematic diagram of an example chamber system in accordance with the invention. A substrate holder 501 and a UV light source 507 are housed within a chamber 500. In some embodiments, a quartz filter is placed between the substrate holder 501 and UV light source 507 (not shown). In alternate embodiments, the light source may be mounted outside the chamber on a window. Controller 513, which is typically a computer processor such as a PC or computer workstation, controls UV light source 507 according to a prescribed modulation regimen. Chamber 500 is capable of holding a vacuum and is connected with a vacuum pump 509 and gauge 511. Chamber 500 may also be connected to a series of vacuum pumps (not shown) to achieve a certain vacuum level. Air can be let back into chamber 500 after an evacuation using inlet valve 515. Chamber 500 may be one chamber in a multi-chambered system or it may be a stand-alone apparatus. Substrate holder 501 holds substrate 503 such that it can be irradiated with light from UV light source 507. Substrate holder 501 has a heater 505 that can heat the substrate to defined temperatures and can be controlled by a temperature controller (not shown).

UV light source 507 is a mercury vapor lamp or other source of UV radiation of the required characteristics; e.g., a laser (not shown), such as an Excimer laser, capable of providing sufficiently intense UV light. In cases where a laser is used, various optical elements may be required to direct the UV light toward portions of the substrate. Methods for directing the laser light at different portions of the substrate at different times may be required as well. In a specific embodiment, the UV source directs UV radiation on the substrate at an intensity of between about 1 $\mu$W/cm$^2$ and 10 W/cm$^2$ in the range of 200 to 400 nanometers.

During normal operation, chamber 500 is first evacuated using vacuum pump 509 to a desired vacuum level as measured by gauge 511. In some embodiments certain gas or mixture of gases are purged through the inlet valve 515 at a chosen flow while the chamber is under vacuum. Next, controller 513 modulates UV light source 507 in a periodic manner to irradiate substrate 503. For example, if a duty cycle of 50% with a period of 60 seconds is used, controller 513 may periodically turn UV light source ON for 30 seconds and then OFF for 30 seconds. After substrate 503 has been treated with modulated UV light for a sufficient amount of time, controller 513 turns UV light source OFF, chamber 500 is brought back to atmospheric pressure by flowing a gas through the inlet valve 515 and substrate 503 is removed from chamber 500.

In this example, it is presumed that controller 513 operates by controlling power to the light source. Other modulation control mechanisms may be employed as well. Some of these will be purely mechanical; e.g., moving irises, choppers, and the like. Others will be optical; e.g., varying lens, mirrors, filters, and the like.

Note that the apparatus depicted in FIG. 5 is only an example of a suitable apparatus and other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source. Some systems may also be used to perform the various operations of a porogen film process such as post-porogen removal anneal and/or silanol capping procedures and/or plasma treatment. Obviously, in cases where different types of operations are used, the chamber system will be configured with inlet valves for letting in processes gases and the chamber will likely be pumped out between each of the operations.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of treating dielectric film on a substrate, the method comprising:
   (a) exposing the dielectric film to ultraviolet radiation with a first light intensity during a first time increment;
   (b) exposing the dielectric film to ultraviolet radiation with a second light intensity during a second time increment, wherein the first and second light intensities are different; and
   (c) repeating (a) and (b) at least twice in a manner that provides modulated ultraviolet radiation exposure that significantly increases the hardness and modulus of the dielectric film.

2. A method of claim 1, wherein the dielectric film is a carbon-doped oxide (CDO) film.

3. A method of claim 2, wherein the carbon-doped oxide (CDO) film is a porous film.

4. A method of claim 3, wherein the hardness of the porous dielectric film is increased by about 0.9 GPa or greater.

5. A method of claim 3, wherein the modulus of the porous dielectric film is increased by about 5.0 GPa or greater.

6. The method of claim 3, wherein the porous dielectric film shrinks by no more than about 25% and more preferably by no more than about 15% during the method.

7. A method of claim 3, wherein the dielectric constant of the porous dielectric film increases by no greater than about 8% during the method and more preferably by no greater than 4%.

8. A method of claim 1, wherein the first and second light intensities differ by a value up to about 3 W/cm$^2$.

9. A method of claim 1, wherein one of the first and second light intensities is about 0 W/cm$^2$.

10. A method of claim 1, wherein the ultraviolet radiation in (a), (b) and (c) is provided by a single ultraviolet radiation source.

11. A method of claim 1, wherein the ultraviolet radiation is provided by one or more sources modulated to provide modulated ultraviolet radiation.

12. A method of claim 11, wherein of the modulated ultraviolet radiation has a duty cycle ranging between about 1% and about 90%.

13. A method of claim 11, wherein the modulated ultraviolet radiation has a period of between about 1µ seconds and 5 minutes.

14. A method of claim 1, wherein the substrate exposure to ultraviolet radiation in (a), (b) and (c) occurs for a total time ranging between about 1 second and about 60 minutes.

15. A method of claim 1, wherein the ultraviolet radiation in (a), (b) and (c) comprises one or more wavelengths ranging between about 150 nm and about 800 nm.

16. A method of claim 1, wherein (a), (b) and (c) are performed at pressures ranging between about 1 µTorr and about 760 Torr (atmospheric pressure).

17. A method of claim 1, wherein a purge procedure is performed after (a) and before (b), after (b) and before (c), the purge procedure involving the use of one or more of Ar, He, $N_2$, $CO_2$, $H_2$, $O_2$, and $C_2H_4$.

18. A method of claim 1, wherein (a), (b) and (c) occur at a constant substrate temperature between about −10 and about 450 degrees.

19. A method of treating dielectric film on a substrate, the method comprising:
   (a) exposing the dielectric film to ultraviolet radiation with a first light intensity during a first time increment;
   (b) exposing the dielectric film to ultraviolet radiation with a second light intensity during a second time increment, wherein the first and second light intensities are different and not zero; and
   (c) repeating (a) and (b) in a manner that provides modulated ultraviolet radiation exposure that significantly increases the hardness and modulus of the dielectric film.

20. The method of claim 19, wherein the first light intensity varies each time (a) is repeated.

21. The method of claim 20, wherein the first light intensity varies randomly.

22. The method of claim 20, wherein the first light intensity decreases each time (a) is repeated.

23. The method of claim 20, wherein the second light intensity varies each time (b) is repeated.

24. The method of claim 19, wherein the dielectric film is a non-porous film.

25. The method of claim 19, wherein the dielectric film is a carbon-doped oxide (CDO) film.

26. The method of claim 25, wherein the carbon-doped oxide (CDO) film is a porous film.

27. The method of claim 19, wherein the first and second light intensities differ by a value up to about 3 W/cm$^2$.

28. The method of claim 19, wherein the substrate exposure to ultraviolet radiation in (a), (b) and (c) occurs for a total time ranging between about 1 second and about 60 minutes.

29. The method of claim 19, wherein the ultraviolet radiation in (a), (b) and (c) comprises one or more wavelengths ranging between about 150 nm and about 800 mm.

30. The method of claim 19, wherein (a), (b) and (c) are performed at pressures ranging between about 1 µTorr and about 760 Torr (atmospheric pressure).

31. The method of claim 19, wherein a purge procedure is performed after (a) and before (b), after (b) and before (c), the purge procedure involving the use of one or more of Ar, He, $N_2$, $CO_2$, $H_2$, $O_2$, and $C_2H_4$.

32. The method of claim 19, wherein (a), (b) and (c) occur at a constant substrate temperature between about 20 and about 450 degrees Celsius.

* * * * *